United States Patent [19]
Yoshida et al.

[11] Patent Number: 5,792,710
[45] Date of Patent: Aug. 11, 1998

[54] METHOD FOR SELECTIVELY ETCHING POLYCIDE LAYER

[75] Inventors: Kazuyoshi Yoshida; Hidenobu Miyamoto; Eiji Ikawa, all of Tokyo, Japan

[73] Assignee: NEC Corporation, Japan

[21] Appl. No.: 814,699

[22] Filed: Mar. 11, 1997

Related U.S. Application Data

[63] Continuation of Ser. No. 410,849, Mar. 27, 1995, abandoned.

[30] Foreign Application Priority Data

Jun. 6, 1994 [JP] Japan ................................. 6-145729

[51] Int. Cl.⁶ ............................................ H01L 21/302
[52] U.S. Cl. .................... 438/721; 438/738; 252/79.1
[58] Field of Search ........................ 156/657.1, 643.1, 156/656.1, 655.1, 662.1, 646.1; 252/72.1; 438/721, 710, 738

[56] References Cited

U.S. PATENT DOCUMENTS

| | | | |
|---|---|---|---|
| 4,479,850 | 10/1984 | Beinvogl et al. | 252/79.1 |
| 4,490,209 | 12/1984 | Hartman | 156/643.1 |
| 4,778,563 | 10/1988 | Stone | 156/643.1 |
| 4,855,017 | 8/1989 | Douglas | 156/646.1 |
| 5,034,348 | 7/1991 | Hartswick et al. | 437/200 |
| 5,112,435 | 5/1992 | Wang et al. | 216/49 |
| 5,238,887 | 8/1993 | Yamada | 437/189 |
| 5,397,744 | 3/1995 | Sumi et al. | 437/192 |
| 5,545,290 | 8/1996 | Douglas | 156/646.1 |

FOREIGN PATENT DOCUMENTS

| | | |
|---|---|---|
| 2-2118 | 1/1990 | Japan. |
| 2-290018 | 11/1990 | Japan. |
| 5-102069 | 4/1993 | Japan. |

*Primary Examiner*—Martin Angebranndt
*Attorney, Agent, or Firm*—Hayes, Soloway, Hennessey, Grossman & Hage, P.C.

[57] ABSTRACT

Disclosed herein is a method of manufacturing a semiconductor device, the method including a step of anisotropic-etching of a high-melting-point (or refractory) metal silicide layer by use of a halogen-containing gas using. This halogen-containing gas has a boron trichloride gas as a main component gas and either one of a chlorine gas or a hydrogen bromide gas as an auxiliary or a sub-component gas.

7 Claims, 8 Drawing Sheets

METHOD FOR SELECTIVELY ETCHING POLYCIDE LAYER

This is a continuation of application Ser. No. 08/410,849 filed on Mar. 27, 1995, now abandoned.

BACKGROUND OF THE INVENTION

1. Field of the Invention

The present invention relates to a method of manufacturing a semiconductor device and, more particularly, to a method of manufacturing a semiconductor device having the step of selectively forming a wiring layer including a refractory metal silicide or a high melting point metal silicide layer or a wiring layer including the so-called polycide layer composed of a refractory metal and polysilicon.

2. Brief Description of Related Prior Art

In recent years, technology for finer patterns with high precision has been in demand accompanying high integration of semiconductor devices. Due to fine geometry of patterns to be worked, the electrical resistance of the wiring layer is increased, which is feared to give rise to a deterioration in characteristics such as speed of the semiconductor devices. For this reason, technology for processing materials having low electrical resistance with high precision is becoming necessary.

For example, along with an increase in integration density, polysilicon, although it is known to exhibit low resistance by being doped with impurities such as phosphorus (P) or boron (B), is becoming difficult to satisfy the conditions imposed on the resistance value because of the nature of the material. Further, the direct use of silicide or a metal with low resistance value and high melting point as a gate electrode leads to problems in the area of various requirements (nonreactivity with the gate oxide film, chemical stability, workability, and the like) in the integrated circuit process. For these reasons, the polycide structure which is a double structure of a metallic silicide film and polysilicon film is adopted, by which it becomes possible to increase the electric conductivity of the silicide film and prevent the reaction between the silicide film and the gate oxide film.

Currently, a tungsten polycide ($WSi_x$/polysilicon) film is being used most generally as the material for the gate electrode and the wirings. In this connection, in the dry etching of the tungsten polycide film on the silicon oxide film, improvements in the dimensional accuracy, verticality of the shape and selectivity ratio relative to the silicon oxide film, in particular, are being desired.

Since the selectivity ratio of the $WSi_x$ film relative to the silicon oxide film is low under the normal etching conditions, the reliability of the silicon oxide film is reduced. It is therefore normal to adopt a two-step etching in which the etching step is switched between the $WSi_x$ film and the polysilicon film.

In that case, considering the controllability and the workability of the etching, a high value for the ratio of the etching rate of the $WSi_x$ film to the polysilicon film (namely, $WSi_x$/polysilicon selectivity ratio) is desired. If the selectivity ratio is low, there is a possibility of generating etching residues which may reduce the reliability of the semiconductor device by causing such a problem as short-circuiting.

In addition, since the resistance of the gate electrode is increased along with the refinement in the pattern, reduction of the resistance by means of an increase in the thickness of the $WSi_x$ film and a decrease in the thickness of the polysilicon film, of the gate electrode, is under investigation.

Because of this, obtaining a higher value for the $WSi_x$/polysilicon selectivity ratio is becoming all the more important. Moreover, reduction in the resistance value of the materials themselves for the gate electrode and the wirings is under examination, and the use of titanium silicide ($TiSi_x$), molybdenum silicide ($MoSi_x$), and the like in place of $WSi_x$ as low resistance materials for the gate electrode and the wirings is being investigated.

In the conventional formation of a gate electrode by the etching of a silicide ($WSi_x$ or $MoSi_x$, in particular)/polysilicon structure formed on a semiconductor substrate via a silicon oxide film, a mixed gas of HCl, $Cl_2$ and $BCl_3$ as the basic gas, with the addition of a fluorine-containing gas (for example, $NF_3$ or $CF_4$), is used as the etching gas for the silicide portion, as disclosed, for example, in Japanese Patent Application Laid-Open No. Sho 62-176134.

Referring to FIG. 12, in the method as disclosed in the above reference, a photoresist film 5 is selectively formed on a refractory metal silicide film 26. This film 26 is in turn formed on a polysilicon layer 3 which is deposited on an oxide layer 2 covering a semiconductor substrate 1. The silicide film 26 is about to be etched using a mixed gas of HCl, $CL_2$ and $BCl_3$ as the basic gas. In this method, further, HCl gas and $Cl_2$ gas that have selectivity to the lower layer 2 such as the gate oxide film is used for etching the lower polysilicon layer 3. It may be therefore possible that the use of the mixed gas of HCl, $Cl_2$ and $BCl_3$ for etching the silicide film 26 can be carried out in the same chamber without interrupting the vacuum condition, namely, that an continuous etching of the silicide film/polysilicon film is feasible.

An example of the etching characteristic of the structure as shown in FIG. 12 is shown in FIG. 13. FIG. 13 shows the dependence of the etching rates of a $WSi_x$ film 26 and a polysilicon film 3 on the flow rate of the added gas ($CF_4$+$O_2$).

From FIG. 13 it can be seen that the $WSi_x$/polysilicon selectivity ratio is improved with the increase in the flow rate of the added gas. The improvement of the $WSi_x$/polysilicon selectivity ratio provides a clean and fiber-free, that is, a residue-free etching.

Here, it is to be noted that the generation of the etching residues is believed to be attributable partly to the greater value of the etching rate of the polysilicon film compared with the etching rate of the $WSi_x$ film, namely, the small value of the $WSi_x$/polysilicon selectivity ratio. As the condition for not generating residues there is set forth a requirement that the $WSi_x$/polysilicon selectivity ratio be greater than two.

The above reference discloses, in addition to the case of polycide films employing $WSi_x$ and $MoSi_x$ that are examined particularly in detail, the case of the titanium polycide ($TiSi_x$/polysilicon) film. According to this, also in the titanium polycide film, residue-free etching can be performed when a mixed gas of HCl, $BCl_3$ and $Cl_2$ is used as the basic gas, by selecting the mixing ratio in such a way that $BCl_3:Cl_2 \geq 1:1$. However, the $TiSi_x$/polysilicon selectivity ratio is more than 2 even in the region $BCl_3:Cl_2 < 1:1$ where residues can be generated.

The following Table 1 shows typical polycide film etching conditions, and Table 2 shows etching conditions for $WSi_x$ and $MoSi_x$ films in particular. From Table 1 it can be seen that at least three kinds of gases are used for polycide etching. Of course, kinds of gases as few as possible is desirable from the viewpoint of the simplicity of the etching mechanism.

TABLE 1

Polycide RIE Etching

| Process Parameter | Silicide Etching | Polysilicon Etching |
| --- | --- | --- |
| Total gas flow rate [sccm] | 180 | 80–140 |
| HCl | 40–75 | 80–100 |
| $Cl_2$ | 60–40 | ≦40 |
| $BCl_3$ | 80–40 | — |
| $CF_6$ | ≦30 | — |
| $O_2$ | ≦10 | — |
| Pressure [mT] | 15–45 | 10–40 |
| DC bias [−volts] | 250–400 | 200–350 |
| Power [W] | 800–1500 | 300–800 |
| Cathode temperature [°C.] | 45–75 | |

TABLE 2

Silicide Etching

| Process Parameter | $WSi_x$ | $MoSi_x$ |
| --- | --- | --- |
| Total gas flow rate [sccm] | 175 | 165 |
| HCl | 75 | 75 |
| $Cl_2$ | 40 | 40 |
| $BCl_3$ | 40 | 40 |
| $CF_6$ | 20 | |
| $O_2$ | | 5–10 |
| Pressure [mT] | 25 | 30 |
| DC bias [−volts] | 350 | 300 |
| Power [W] | 1350 | 1350 |
| Cathode temperature [°C.] | 45 | 45 |

Thus, the residue-free etching is realized by using as an etching gas for the silicide film a basic gas which is a mixture of HCl, $Cl_2$ and $BCl_3$ to which is added further a fluorine-containing gas. However, the kinds of gases used are large in number, and they are complicated as a system of gases. As the number of kinds of gases becomes large, etching becomes difficult to control so that it is desirable to carry out the etching using as few kinds of gases as possible from the viewpoint of the simplicity of the etching mechanism.

Although the silicide/polysilicon selectivity ratio for varying ratio of $BCl_3:Cl_2$ is shown in the prior art, the HCl gas is indispensable for providing a clean etching which does not leave residues on the wafers, so that at least three kinds of gases are needed to be used.

In the prior art, it is further concluded that the generation of the etching residues is caused by the difference between the etching rates of the silicide film and the polysilicon film, and that there will be no generation of the etching residues when the silicide/polysilicon selectivity ratio exceeds 2. However, from the fact that residues were generated in the case of etching the titanium silicide film where the $TiSi_x$/polysilicon selectivity ratio exceeded 2 it has to be said that the generation of the residues is not caused based on the difference between the etching rates of the titanium silicide film and the polysilicon film. In fact, residues were generated even when etching was interrupted in the midst of the etching of the titanium silicide film.

On the other hand, when the etching selectivity ratio of the titanium silicide film and the polysilicon film on the lower layer is not sufficiently high, working defect is generated in the pattern due to microloading. Here, microloading is defined as the phenomenon that the etching rate varies depending upon the fineness of the pattern. Due to the microloading, at those spots where the interval between the patterns are narrow and the regions to be etched are narrow, patterns to be left unetched are isolated, and the etching rate becomes low compared with the etching rate for the surrounding regions to be etched. Variations in the arrangement of the wiring patterns are inevitable due to the restrictions in the design, but it is said that working of fine patterns where the etching rate is low becomes possible by introducing overetching. In order to accomplish that, the etching selectivity ratio relative to the underlying layer has to be high, that is, the etching rate for the underlying polysilicon film during the etching of the silicide film has to be low.

SUMMARY OF THE INVENTION

It is, therefore, an object of this invention to provide an improved method of selectively etching a polycide layer including refractory metal silicide.

It is another object of the present invention to provide a method of manufacturing a semiconductor device which enables to reduce the number of gaseous species and use a handy gas system, and makes it possible to carry out anisotropic etching which is free from silicide etching residues and has a high selectivity ratio to the underlying polysilicon film. As will be made clear in the following.

It is still another object of the present invention to provide a method of manufacturing a semiconductor device which can carry out a residue-free anisotropic etching having a high selectivity ratio relative to the underlying polysilicon film, in titanium silicide etching.

A method of manufacturing a semiconductor device according to the present invention is featured in that a refractory or high-melting-point metal silicide film is etched by a halogen-containing gas including a boron trichloride gas as a main component gas and either one of a chlorine gas or a hydrogen bromide gas as an auxiliary or sub-component gas.

It is convenient that the halogen-containing gas consists of more than 25% of boron trichloride and hydrogen bromide gas for the remainder.

According to another aspect of the present invention, such a method of manufacturing a semiconductor device is obtained that a high melting point metal silicide film is etched by a halogen-containing gas including a boron trichloride gas, either one of a chlorine gas or a hydrogen bromide gas, and a rare gas.

As a preferred mode of this invention, when etching a titanium silicide film or a titanium silicide/polysilicon laminated film formed on a semiconductor substrate via a silicon oxide film with a reactive ion etching system using a photoresist pattern as a mask, a mixed gas of boron trichloride gas and chlorine gas is used as the gas for anisotropically etching the titanium silicide film, wherein the flow rate of the boron trichloride gas is set to be more than 50% of the total gas flow rate.

As a further preferred mode of this invention, when etching a titanium silicide film or a titanium silicide/polysilicon laminated film formed on a semiconductor substrate via a silicon oxide film with a reactive ion etching system using a photoresist pattern as a mask, a mixed gas of boron trichloride gas and hydrogen bromide gas is used as the gas for anisotropically etching the titanium silicide film, wherein the flow rate of the boron trichloride gas is set to be more than 25% of the total gas flow rate.

According to this invention, when etching a polycide film, preferably a titanium polycide film, formed on a semiconductor substrate via a silicon oxide (SiO$_2$) film using a mask, residue-free anisotropic etching is made available by employing a gas containing boron trichloride (BCl$_3$) as the etching gas for the titanium silicide (TiSi$_x$) film. Moreover, according to this invention, the number of gaseous species of the halogen-containing gas for silicide etching is reduced to two, and the ratio of the silicide etching rate/polysilicon etching rate (selectivity ratio) is increased. Furthermore, in this invention, by the addition of a rare gas, preferably helium or the like, the plasma is spread and the uniformity of etching is improved.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF THE PREFERRED EMBODIMENTS

Figure 2:
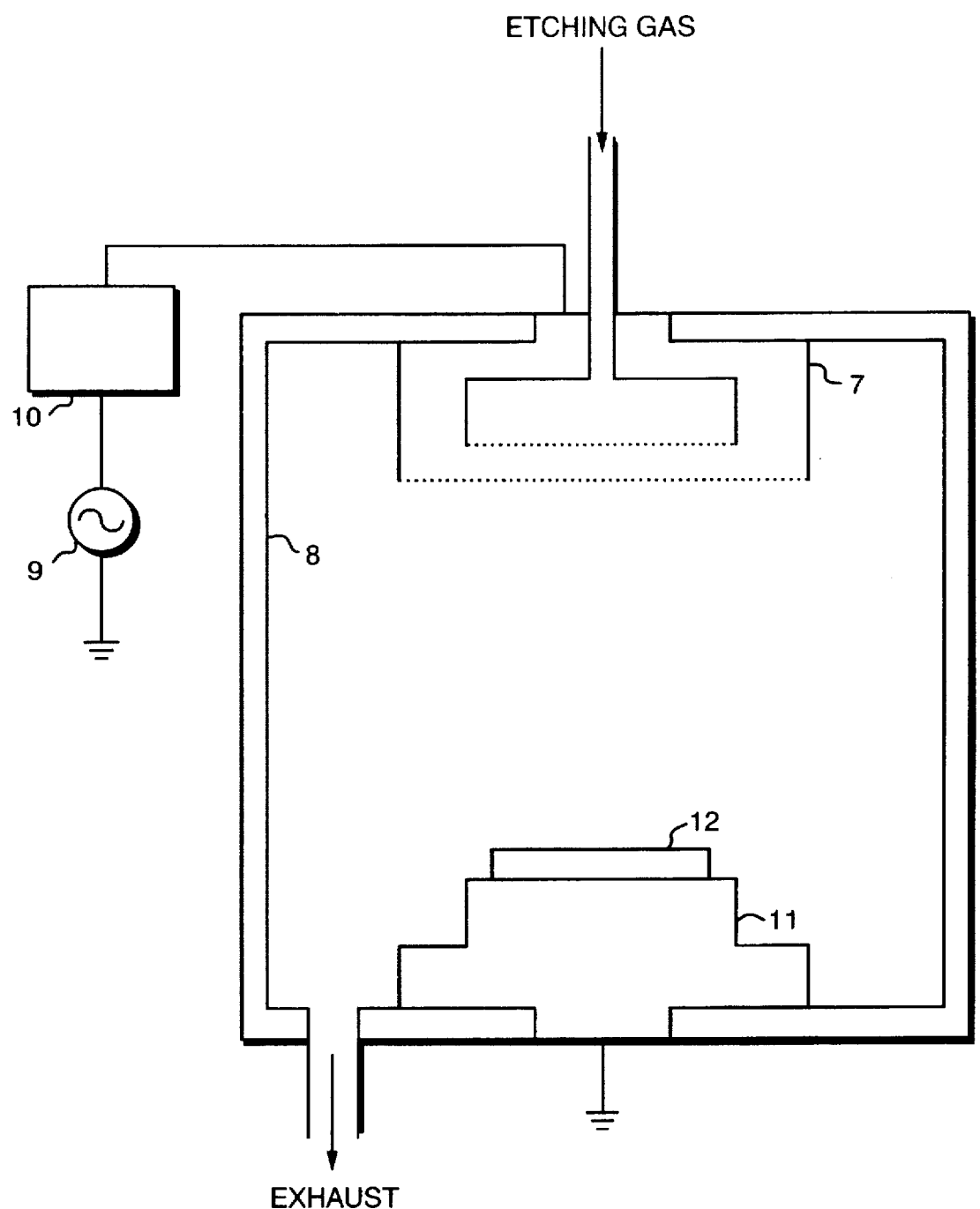
FIG. 2 is a conceptual view of a reactive ion etching system.

Referring at first to FIG. 2, the description will be mode on a reactive ion etching (RIE) system employed in the present invention. This system is of a diode parallel plates type. In this the FIG., 7 is an upper electrode served for supplying the etching gas in addition to as an electrode, 8 is a vacuum chamber, 9 is an RF power supply, 10 is a matching box, 11 is a lower electrode served also as a stage for placing a sample 12. By use of this system, target layers or films are etched away.

Figure 1A:
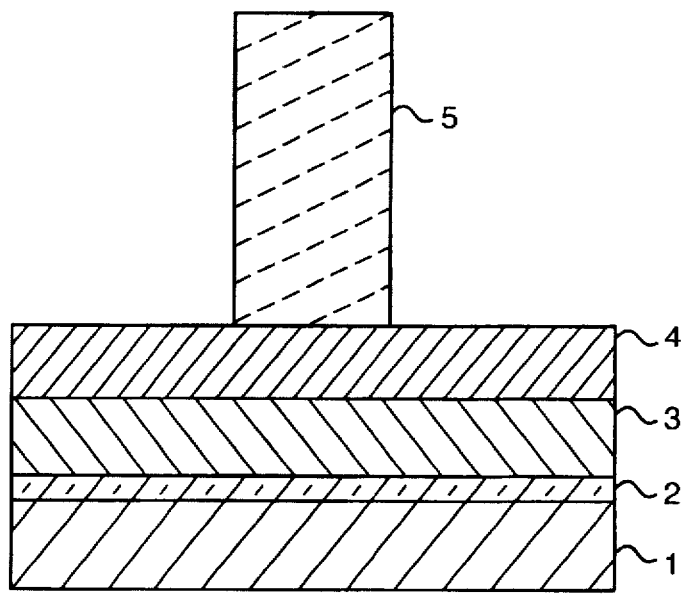
FIGS. 1A and 1B are sectional views illustrative of steps of a method according to each embodiment of the present invention.

Turning now to FIG. 1, a titanium silicide film of a titanium polycide structure is etched using the RIE system as shown in FIG. 2 in accordance with the first embodiment of this invention. In the device as shown in FIG. 1A, a 100 Å-thick SiO$_2$ film 2 is formed on a semiconductor substrate 1 by thermal oxidation, followed by forming a 1500 Å-thick polysilicon film 3 thereon by use of the CVD method. If desired, phosphorus (P) impurities are doped in the film 3. A 1500 Å-thick TiSi$_x$ film 4 is deposited on the polysilicon film 3 by, for example, sputtering method. The TiSi$_x$ film 4 is then selectively covered by a 1 µm-thick and 0.4-µm wide photoresist mask 5. In this embodiment, a gate electrode is intended to be formed by etching the TiSi$_x$ film and the polysilicon film by using the photoresist film 5 as a mask.

The device thus prepared is loaded into the RIE system as shown in FIG. 2, and the TiSi$_x$ film 4 and the polysilicon film 3 are dry-etched using the resist mask 5 as the mask by supplying various kinds of etching gases in accordance with the present invention.

Etching is carried out by varying the gaseous species by fixing the pressure, RF power and the temperature of the lower electrode as shown in Table 3. The total flow rate of the etching gases is set to be 100 sccm.

TABLE 3

| Pressure | RF Power | Lower Electrode Temperature | Total Gas Flow Rate |
| --- | --- | --- | --- |
| 150 m Torr | 300 W | 40° C. | 100 sccm |

Figure 3:
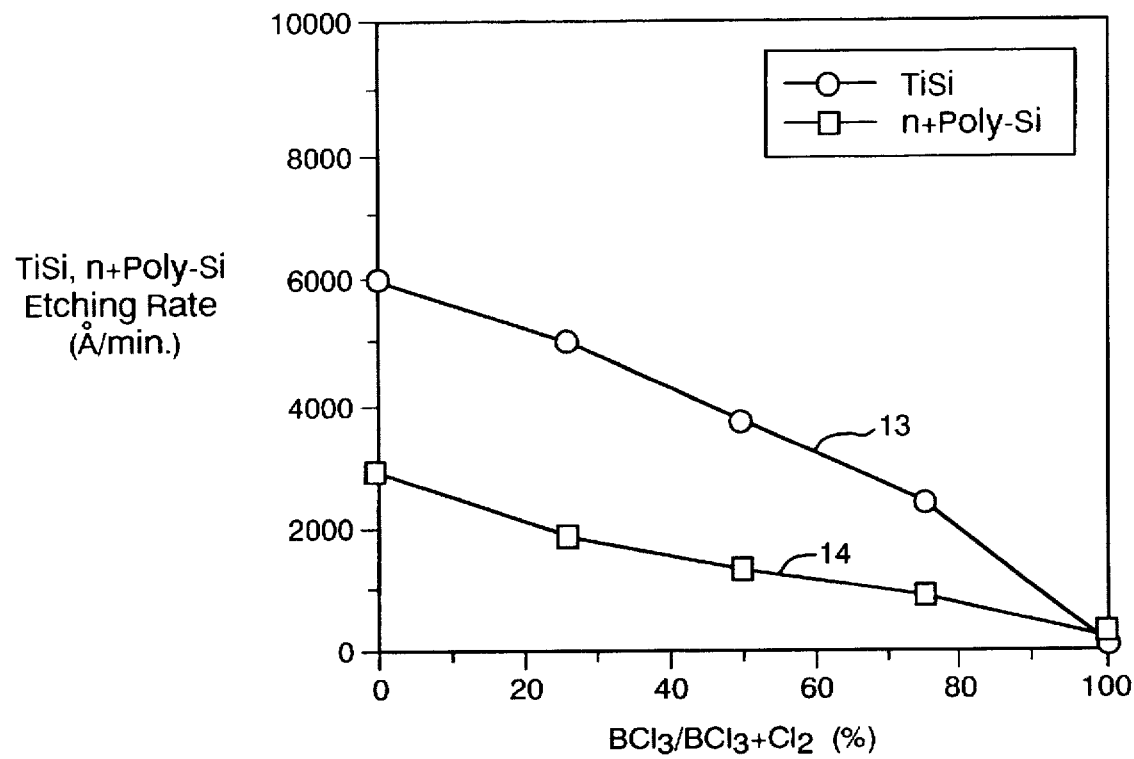
FIG. 3 is a diagram showing the etching rates of the TiSi$_x$ film and the polysilicon film when the BCl$_3$ flow rate of the mixed gas of BCl$_3$ and Cl$_2$ is varied in the first embodiment of the invention.
Figure 4:
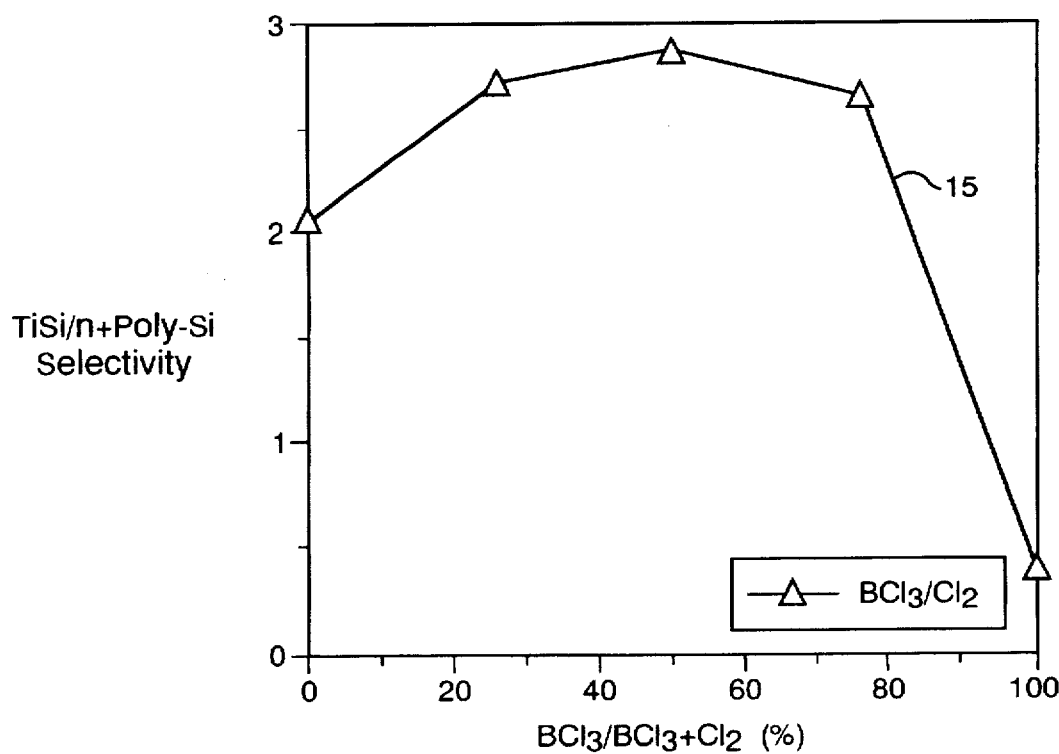
FIG. 4 is a diagram showing the ratio (selectivity ratio) of TiSi$_x$ etching rate/polysilicon etching rate when the BCl$_3$ flow rate of the mixed gas of BCl$_3$ and Cl$_2$ is varied in the first embodiment of the invention.

In the present embodiment, when a mixed gas of BCl$_3$ gas and Cl$_2$ gas is used as the etching gas, the etching rates 13 and 14 of the TiSi$_x$ film and the polysilicon film, respectively, as functions of the flow rate of BCl$_3$ are shown in FIG. 3, and the TiSi$_x$/polysilicon selectivity ratio 15 is shown in FIG. 4.

As shown in FIG. 3, the etching rates 13 and 14 of the TiSi$_x$ film and the polysilicon film decrease with the increase in the flow rate of BCl$_3$. The etching rates are determined by the flow rate of Cl$_2$, and etching proceeds scarcely when the flow rate of BCl$_3$ is 100%.

Further, as shown in FIG. 4, the TiSi$_x$/polysilicon selectivity ratio 15 exceeds 2 even for 0% of BCl$_3$ mixing ratio, except for the case of 100% of BCl$_3$, and approaches 3 as the content of BCl$_3$ increases.

Figure 1B:
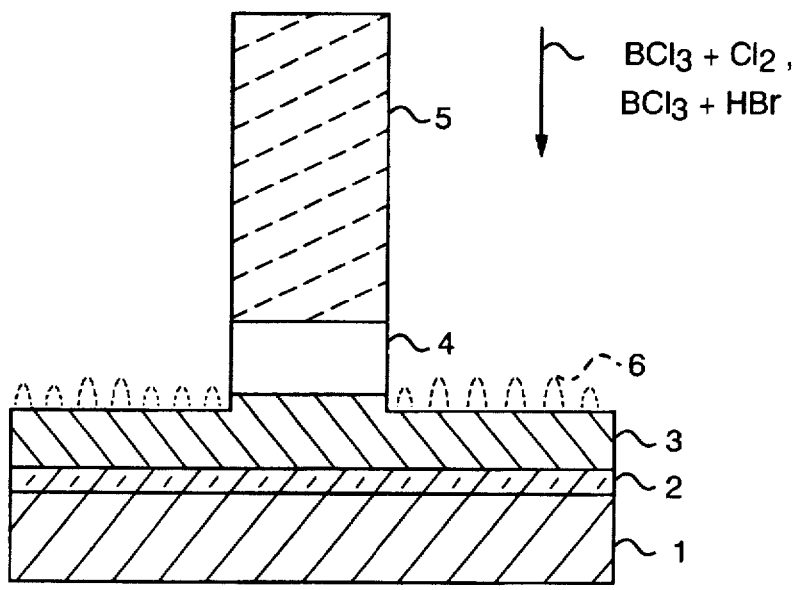

Observation of the shape obtained by the etching revealed that it is anisotropic for all cases, and residues were found generated when the content of BCl$_3$ was 0 and 25%, as shown by a reference numeral 6 in FIG. 1B. The relative abundance of residues was smaller for the case of BCl$_3$ content of 25%.

The BCl$_3$ gas has the effect of suppressing the generation of the residues, and it is possible to obtain a residue-free anisotropic shape by setting the mixing ratio of BCl$_3$ gas to be more than 50%. In that case, etching proceeds in a state where the surface to be etched remains planar.

Even when microloading occurs, the TiSi$_x$/polysilicon selectivity ratio is at a high value of 3, so that the microloading can substantially be reduced by carrying out overetching.

When the mixing ratio of the $BCl_3$ gas is 50%, the etching rate of the $TiSi_x$ film is 3650 Å/min, the etching rate of the polysilicon film is 1260 Å/min, and their selectivity ratio is 2.9.

Figure 5:
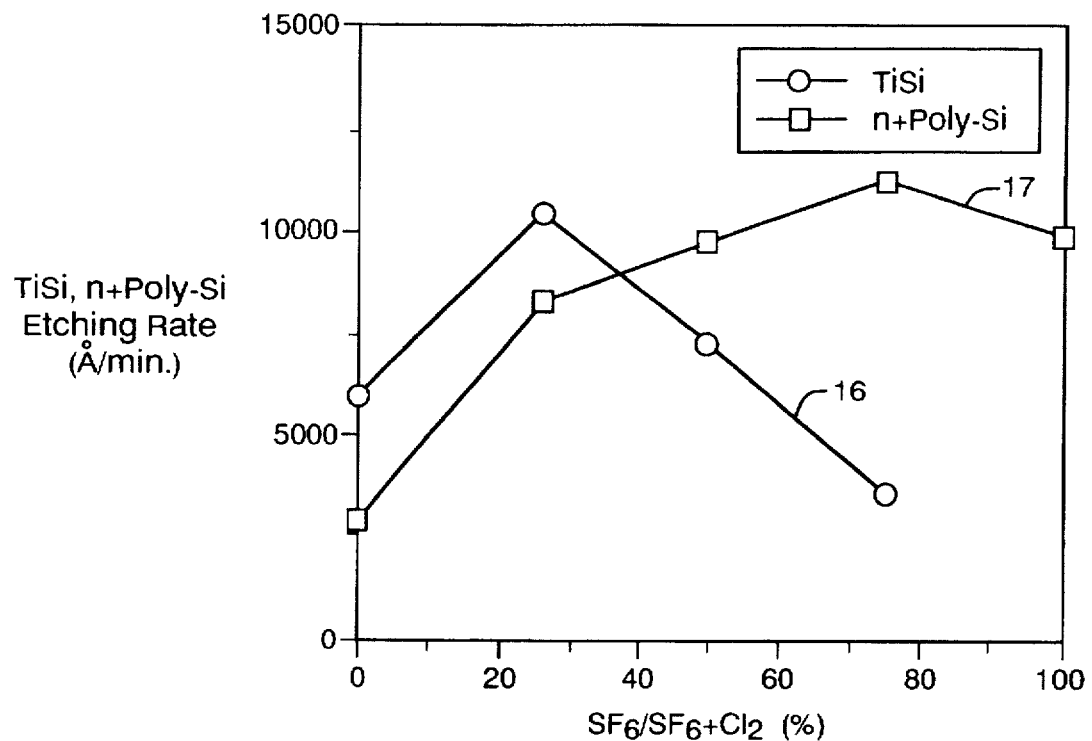
FIG. 5 is a diagram showing, as a comparative example, the etching rates of the TiSi$_x$ film and the polysilicon film when the SF$_6$ flow rate of the mixed gas of SF$_6$ and Cl$_2$ is varied.
Figure 7:
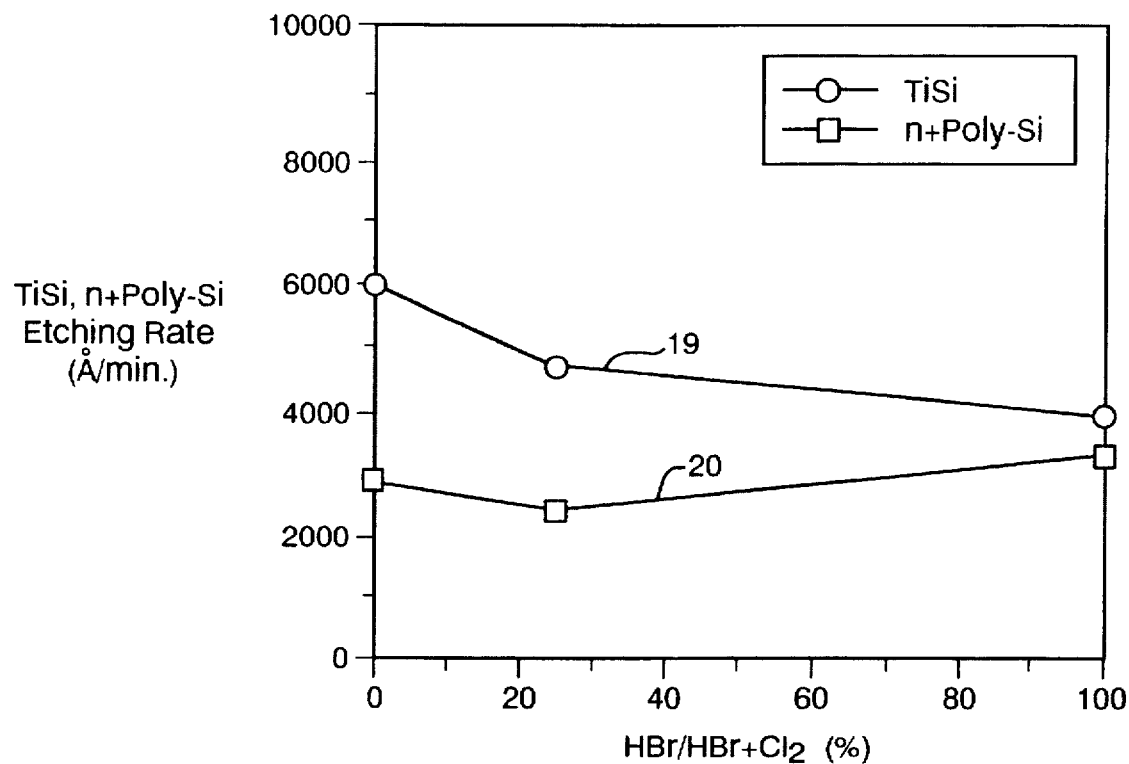
FIG. 7 is a diagram showing, as a comparative example, the etching rates of the TiSi$_x$ film and the polysilicon film when the HBr flow rate of the mixed gas of HBr and Cl$_2$ is varied.

As comparative examples, the etching rates 16 and 17, and 19 and 20 of the $TiSi_x$ film and the polysilicon film for the cases where the mixed gas of $SF_6$ and $Cl_2$ and the mixed gas of HBr and $Cl_2$, respectively, which are normally used for the etching of tungsten silicide ($WSi_x$) film, are used are presented in FIG. 5 and FIG. 7.

Figure 6:
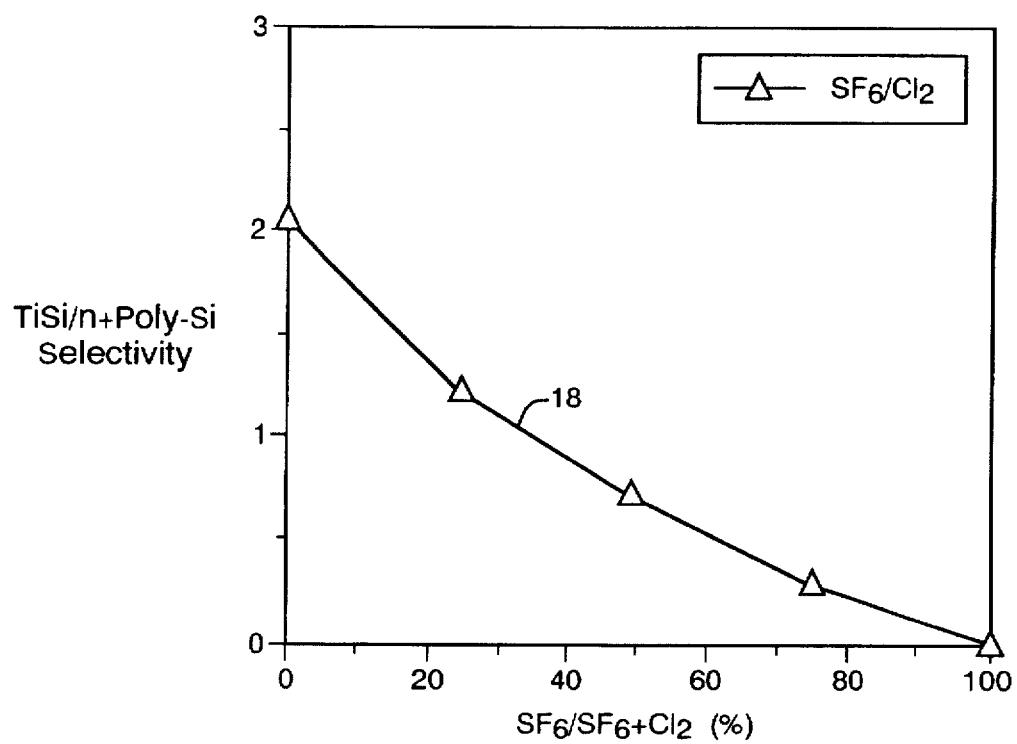
FIG. 6 is a diagram showing, as a comparative example, the ratio (selectivity ratio) of TiSi$_x$ etching rate/polysilicon etching rate when the SF$_6$ flow rate of the mixed gas of SF$_6$ and Cl$_2$ is varied.
Figure 8:
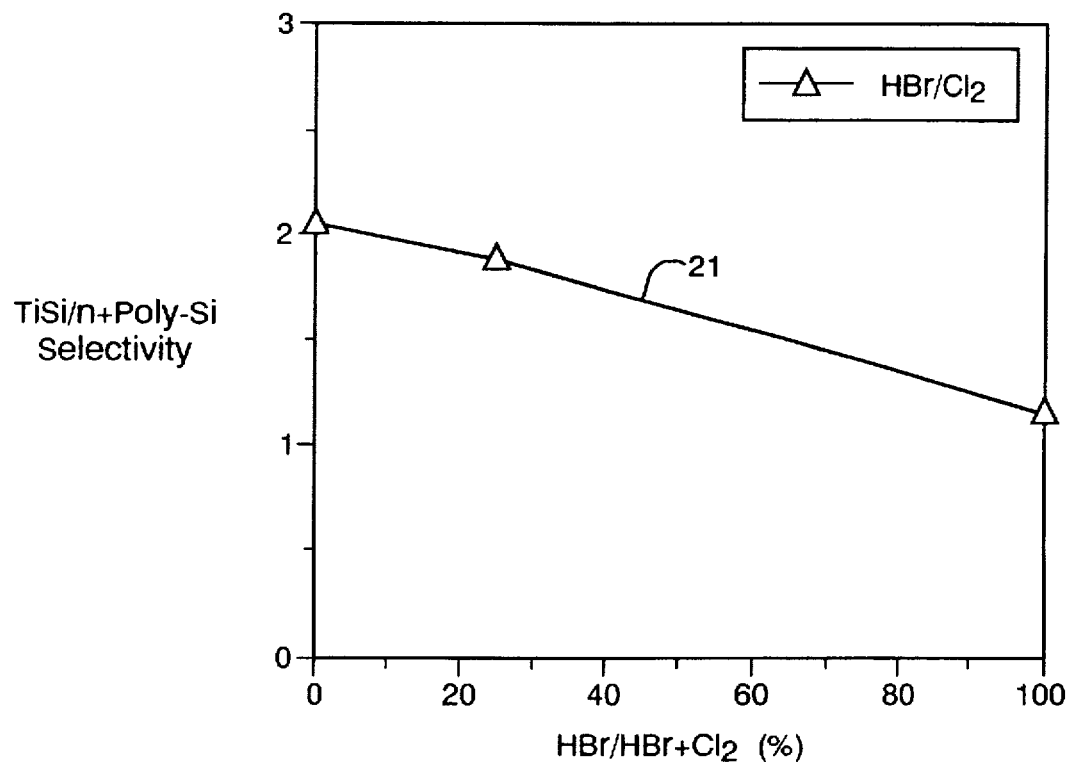
FIG. 8 is a diagram showing, as a comparative example, the ratio (selectivity ratio) of TiSi$_x$ etching rate/polysilicon etching rate when the HBr flow rate of the mixed gas of HBr and Cl$_2$ is varied.

In addition, the $TiSi_x$/polysilicon selectivity ratios 18 and 21 for the cases of using the mixed gas of $SF_6$ and $Cl_2$ and the mixed gas of HBr and $Cl_2$ as the etching gas are shown in FIG. 6 and FIG. 8.

Since the etching rate 16 of the $TiSi_x$ film decreases and the etching rate 17 of the polysilicon film increases with the increase in the $SF_6$ flow rate, as shown in FIG. 5, the selectivity ratio 18 decreases as shown in FIG. 6. As regards the change of the etched shape with the increase in the $SF_6$ flow rate, there was observed an increase in the side etching. Further, residues are generated in all cases regardless of the flow rate of $SF_6$.

In the case of the mixed gas of HBr and $Cl_2$ gases, the etching rate 19 of the $TiSi_x$ film decreases gradually with the decrease in the HBr flow rate, while the etching rate 20 of the polysilicon film remains substantially constant as shown in FIG. 7. Because of that, the selectivity ratio 21 decreases as shown in FIG. 8. The shape of the etching product is anisotropic for all cases, but the amount of the residues increases with the increase in the flow rate of HBr.

Figure 9:
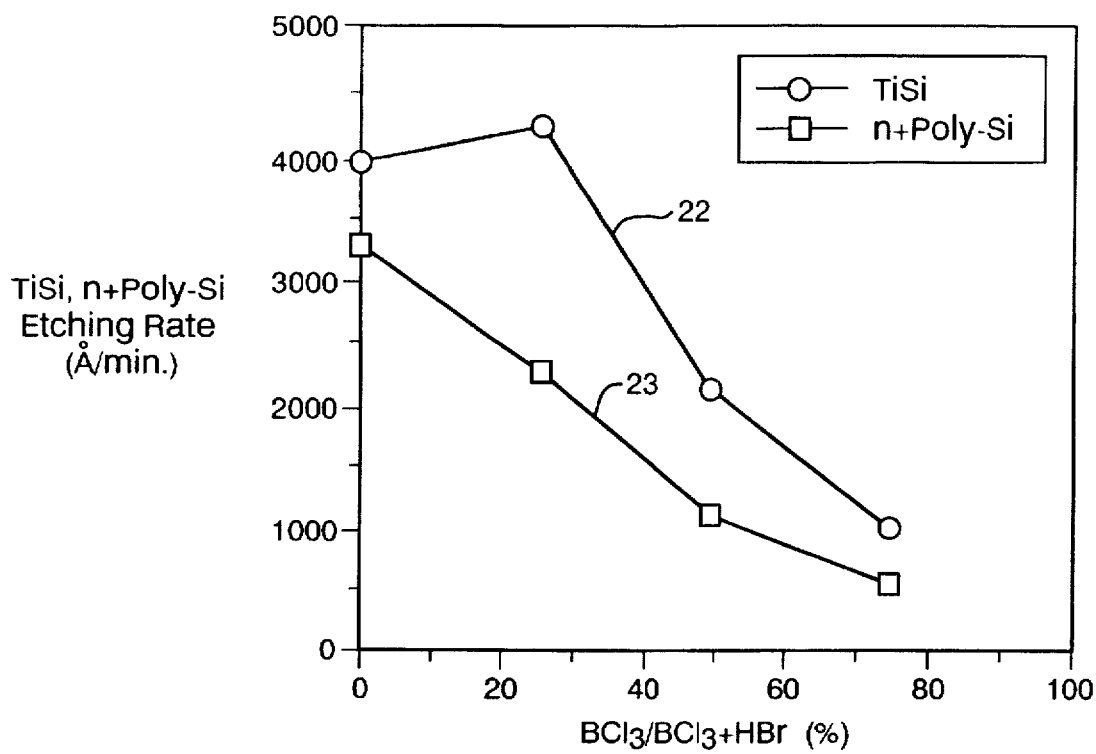
FIG. 9 is a diagram showing the etching rates of the TiSi$_x$ film and the polysilicon film when the BCl$_3$ flow rate of the mixed gas of BCl$_3$ and HBr is varied in the second embodiment of the invention.
Figure 10:
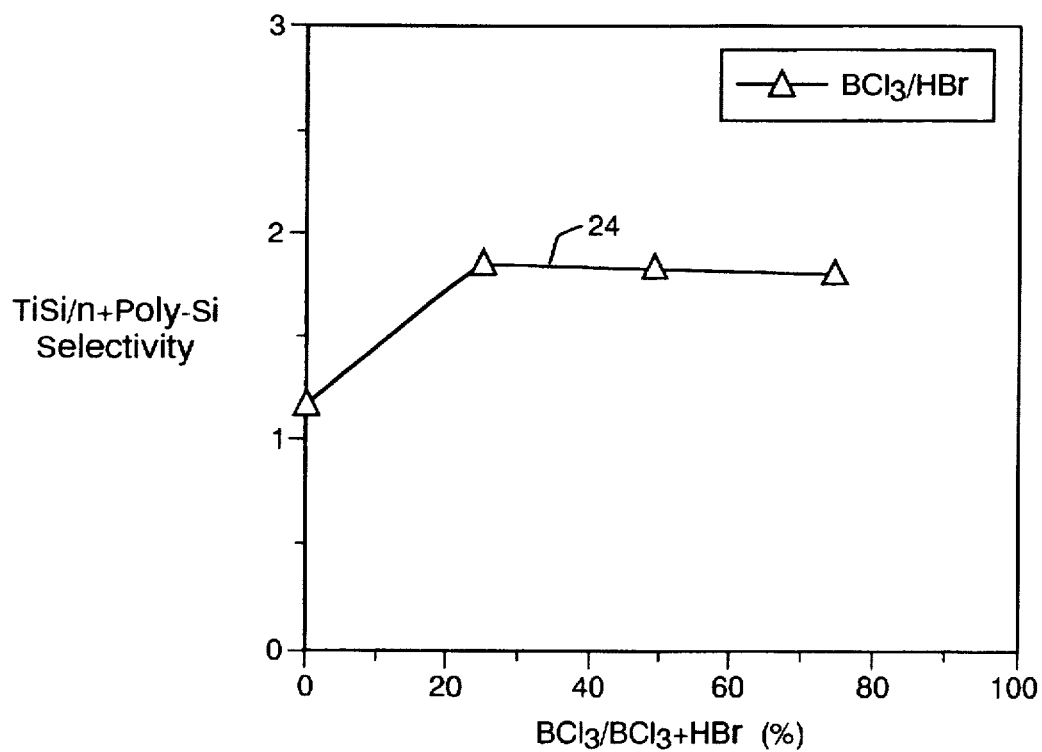
FIG. 10 is a diagram showing the ratio (selectivity ratio) of TiSi$_x$ etching rate/polysilicon etching rate when the BCl$_3$ flow rate of the mixed gas of BCl$_3$ and HBr is varied in the second embodiment of the invention.

Next, as a second embodiment of this invention, the case of using the mixed gas of $BCl_3$ gas and hydrogen bromide (HBr) gas as the etching gas in which the $BCl_3$ flow rate is varied is taken up, and the etching rates 22 and 23 of the $TiSi_x$ and polysilicon films for this case are shown in FIG. 9, and the $TiSi_x$/polysilicon selectivity ratio 24 is shown in FIG. 10.

The etching rates of the $TiSi_x$ film and the polysilicon film decrease with the increase in the $BCl_3$ flow rate. The selectivity ratio is 1 when the mixing ratio of $BCl_3$ is 0%, but it becomes 2 when $BCl_3$ reaches 25%. However, the selectivity ratio remains at 2 even when the $BCl_3$ flow rate is increased.

The shape of the etched product is anisotropic for all cases, but microloading increases with the increase in the $BCl_3$ flow rate.

Residues are generated for 0% of the $BCl_3$ flow rate, but there is no generation for $BCl_3$ flow rate above 25%. The $BCl_3$ gas has the effect of suppressing residues also in the case of mixed gas of $BCl_3$ and HBr, and a residue-free anisotropic shape can be obtained for the $BCl_3$ flow rate exceeding 25%. At the mixing ratio of 25%, the etching rate of the $TiSi_x$ film is 4225 Å/min, the etching rate of the polysilicon film is 2252 Å/min, and their selectivity ratio is 1.9.

Figure 11:
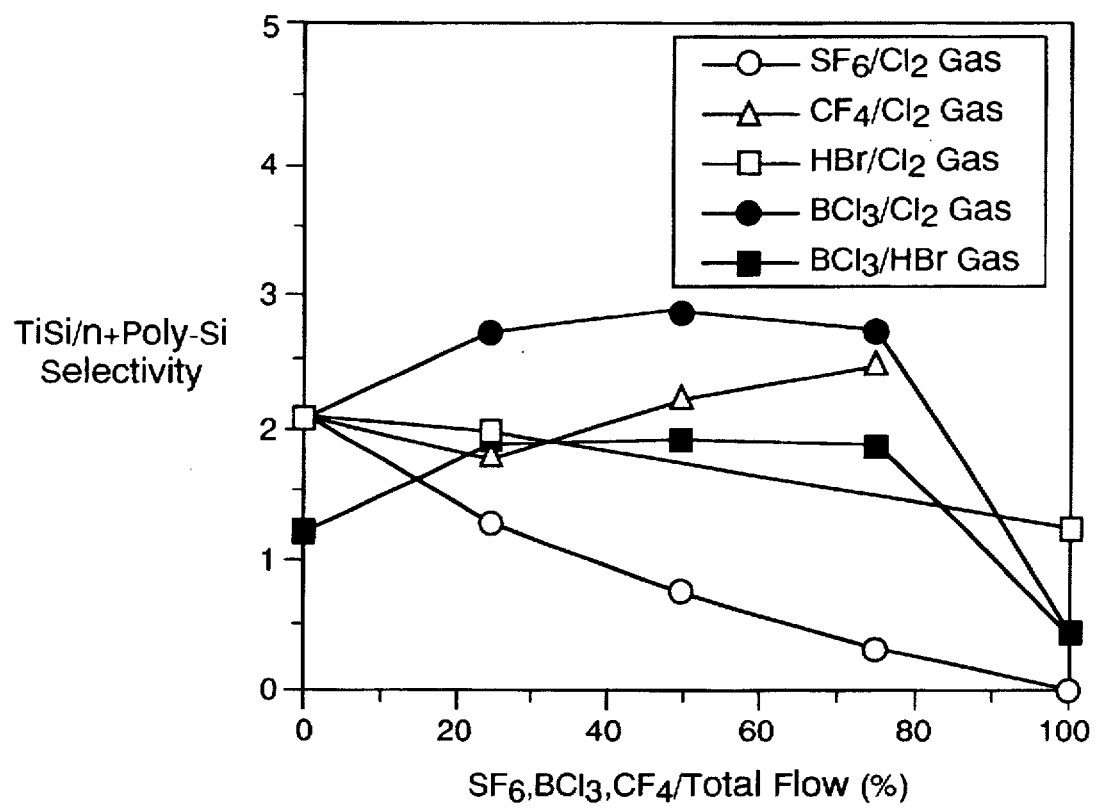
FIG. 11 is a diagram showing the ratio (selectivity ratio) of TiSi$_x$ etching rate/polysilicon etching rate for varying mixing ratio when different gas systems are used.
Figure 12:
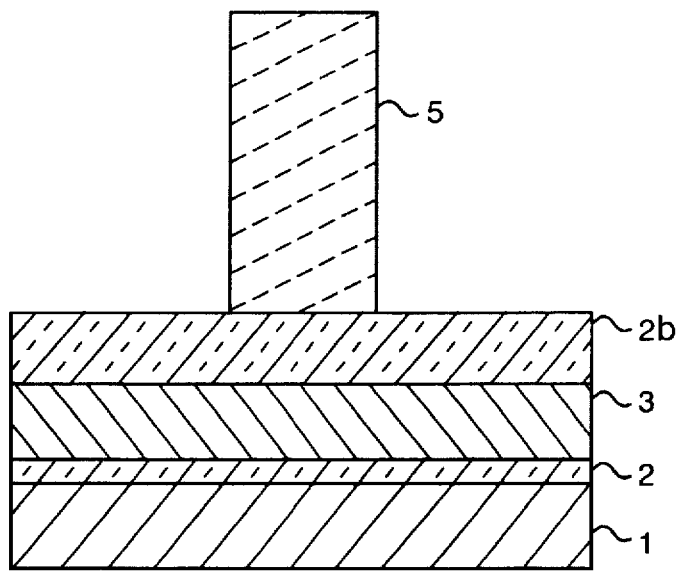
FIG. 12 is a sectional view showing the prior art.
Figure 13:
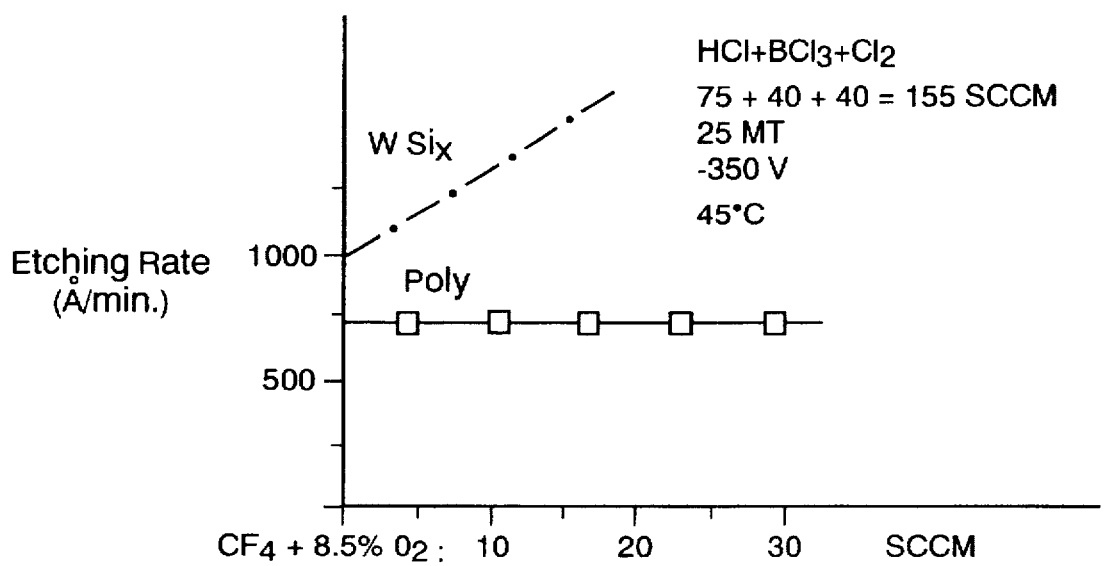
FIG. 13 is a diagram showing the etching characteristic of tungsten silicide in the prior example.

A comparative example of the $TiSi_x$/polysilicon selectivity ratios for the use of different kinds of gases is shown in FIG. 11, and the occurrence status of etching residues is summarized in Table 4. From FIG. 11 and Table 4 it can be seen that $BCl_3$ gas has the effect of improving the selectivity ratio relative to the polysilicon film and suppressing the generation of etching residues. In addition, as can be seen from Table 4, $BCl_3$ gas inhibits the generation of etching residues when its mixing ratio exceeds 50% in the case of the mixed gas of $BCl_3$ and $Cl_2$ and when its mixing ratio exceeds 25% in the case of the mixed gas of $BCl_3$ and HBr.

In contrast, in the cases of $SF_6/Cl_2$, $CF_4/Cl_2$, and $HBr/Cl_2$ generation of etching residues is observed for all mixing ratios. Moreover, the $TiSi_x$/polysilicon selectivity ratio is large in the first and the second embodiments, and the microloading can essentially be eliminated by carrying out overetching. As shown in FIG. 11, for both of the first and second embodiments, the $TiSi_x$/polysilicon selectivity ratio remains at a high value for $BCl_3$ content of up to about 75% of the total gas flow rate.

TABLE 4

| Gas 1/Gas 2 | Rate of Gas 1 to Total Flow Rate (%) | | | | |
| --- | --- | --- | --- | --- | --- |
| | 0 | 25 | 50 | 75 | 100 |
| $SF_6/Cl_2$ | x | x | x | x | x |
| $CF_4/Cl_2$ | x | x | x | x | x |
| $HBr/Cl_2$ | x | x | x | x | x |
| $BCl_3/Cl_2$ | x | x | o | o | o |
| $BCl_3/HBr$ | x | o | o | o | o | x: with residue
o: without residue

The first embodiment of this invention has a larger $TiSi_x$/polysilicon selectivity ratio than the second embodiment. However, the second embodiment has an advantage in that it does not generate contamination since no etching of the chamber and the contaminant attached to it is involved.

As a third embodiment of this invention, helium (He) is added to the mixed gas of $BCl_3$ gas and $Cl_2$ gas, or the mixed gas of $BCl_3$ gas and HBr gas. By so doing, the plasma spreads more readily, the uniformity of etching is improved and there occurred no generation of residues. Here, the appropriate amount of He gas to be added is considered to be up to about 50% of the total amount of the gases.

As mentioned in the above, residues are generated during silicide etching even when the $TiSi_x$/polysilicon selectivity ratio exceeds 2. However, generation of the residues can be reduced by adding $BCl_3$ gas to increase its flow rate. The etching mechanism of the $BCl_3$ gas is mainly due to its ionicity, i.e. physical sputtering. Because of this, there is a possibility that grains of oxide of Ti and Si exist in the titanium silicide film, and it is considered that residues are generated with these oxide grains as micro-masks.

It should be noted that even if a rare gas such as He is added as a third gas to the mixed gas of $HCl_3$ and $Cl_2$, or to the mixed gas of $BCl_3$ and HBr for the purpose of improving its uniformity, realization of residue-free anisotropic etching is not affected at all.

In the above, the present invention has been described with reference to the various kinds of embodiments, but this invention is by no means limited to the modes of the aforementioned embodiments, and needless to say, is applicable to various kinds of modes that are in accordance with the principle of this invention. For example, parameters such as the pressure, the RF power and the temperature of the lower electrode are not limited to those values given in Table 3, and can be changed to other values for the purpose of, for example, optimization of the etching shape. In addition, this invention is not limited to the RIE system described in conjunction with the embodiment in the above, and is also applicable to other etching systems. Moreover, in the above embodiments, this invention has been described with titanium silicide, which is drawing attention as a low resistance material for the gate electrode and the wirings, as an example, but this invention is applicable also to high melting point metallic silicide other than titanium silicide.

As described in the above, this invention makes it possible to markedly reduce the number of gaseous species compared with the prior example, and accomplish residue-free anisotropic etching. Moreover, according to this invention, the ratio (selectivity ratio) of silicide etching rate/polysilicon etching rate can be increased, so that despite the use of handy gaseous species in the etching of the polycide structure, it is possible to improve the margin, controllability and micromachinability of the etching process, and substantially suppress the microloading by carrying out overetching. Furthermore, by the addition of a rare gas, this invention provides the effect of spreading the plasma more widely, and improving the uniformity of etching.

It is apparent that the present invention is not limited to the above embodiments but may be modified and changed without departing from the scope and spirit of the invention.

What is claimed is:

1. A method of etching selectively a refractory metal-silicide layer laminated on a polysilicon layer formed on a silicon substrate, said method comprising the step of anisotropically etching said refractory metal silicide layer by an etching gas that consists of a boron trichloride gas as a main component and a hydrogen bromide gas as an auxiliary component, said etching gas comprising more than 25% boron trichloride gas so that residues are not formed on said polysilicon layer.

2. The method as claimed in claim 1, wherein said etching gas further contains a rare gas.

3. The method as claimed in claim 1, wherein said refractory metal silicide film is a titanium silicide film.

4. The method as claimed in claim 3, wherein said titanium silicide film is formed on a polysilicon film.

5. A method of manufacturing a semiconductor device comprising the steps of: forming a silicon oxide film on a semiconductor substrate, forming a polysilscon layer on said silicon oxide film, forming a titanium silicide film on said polysilicon layer, selectively etching said titanium silicide film over said polysilicon layer by use of an etching gas that contains a boron trichloride gas and a hydrogen bromide gas, said boron trichloride gas having a flow rate set to be more than 25% of a total gas flow rate so that residue are not formed on said polysilicon layer.

6. The method as claimed in claim 5, wherein said etching gas further contains a rare gas.

7. The method as claimed in claim 6, wherein said rare gas includes a helium gas.

* * * * *

UNITED STATES PATENT AND TRADEMARK OFFICE
CERTIFICATE OF CORRECTION

PATENT NO. : 5,792,710
DATED : August 11, 1998
INVENTOR(S) : Kazuyoshi Yoshida, Hidenobu Miyamoto and Eiji Ikawa It is certified that error appears in the above-identified patent and that said Letters Patent is hereby corrected as shown below:

Claim 1, Col. 9, line 18, "metal-" should be --metal--.

Claim 5, Col. 10, line 7, "polysilscon" should be --polysilicon--.

Claim 5, Col. 10, line 17, "residue" should be --residues--.

Signed and Sealed this

Twenty-sixth Day of January, 1999

Attest:

Attesting Officer

*Acting Commissioner of Patents and Trademarks*